(12) United States Patent
Yoshida et al.

(10) Patent No.: US 6,603,197 B1
(45) Date of Patent: Aug. 5, 2003

(54) SEMICONDUCTOR UNIT

(75) Inventors: Hiroshi Yoshida, Fukuoka (JP);
Hisashi Kawafuji, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/314,237

(22) Filed: Dec. 9, 2002

(30) Foreign Application Priority Data

Jun. 12, 2002 (JP) ........................................ 2002-171811

(51) Int. Cl.[7] .............................................. H01L 23/495
(52) U.S. Cl. ........................ 257/676; 257/666; 257/723
(58) Field of Search ............................... 257/676, 666, 257/787, 723, 669

(56) References Cited

U.S. PATENT DOCUMENTS 5,714,799 A * 2/1998 Okumura ................... 257/676
6,528,868 B1 * 3/2003 Weiblen et al. ............ 257/669

FOREIGN PATENT DOCUMENTS

| JP | 3-272163 | 12/1991 |
| JP | 11-307721 | 11/1999 |

* cited by examiner

*Primary Examiner*—Roy Potter
(74) *Attorney, Agent, or Firm*—Oblon, Spivak, McClelland, Maier & Neustadt, P.C.

(57) ABSTRACT

A semiconductor power module that can be downsized and is a malfunction-resistant is provided. In a semiconductor unit, a first circuit with a first semiconductor chip mounted on a first lead frame and a second circuit with a second semiconductor chip mounted on a second lead frame are sealed in a resin package. The first lead frame and the second lead frame are arranged to be overlapped. According to this arrangement, physical dimensions can be reduced as compared to a conventional semiconductor module in which no practical overlap exists. In addition, since the module is packaged using resin, the noise resistance of the semiconductor unit can be improved and malfunction can be still more reduced.

13 Claims, 7 Drawing Sheets

SEMICONDUCTOR UNIT

BACKGROUND OF THE INVENTION

1. Field of the Invention

The present invention relates to a structure of semiconductor power module.

2. Description of the Background Art

Figures 9A, 9B:
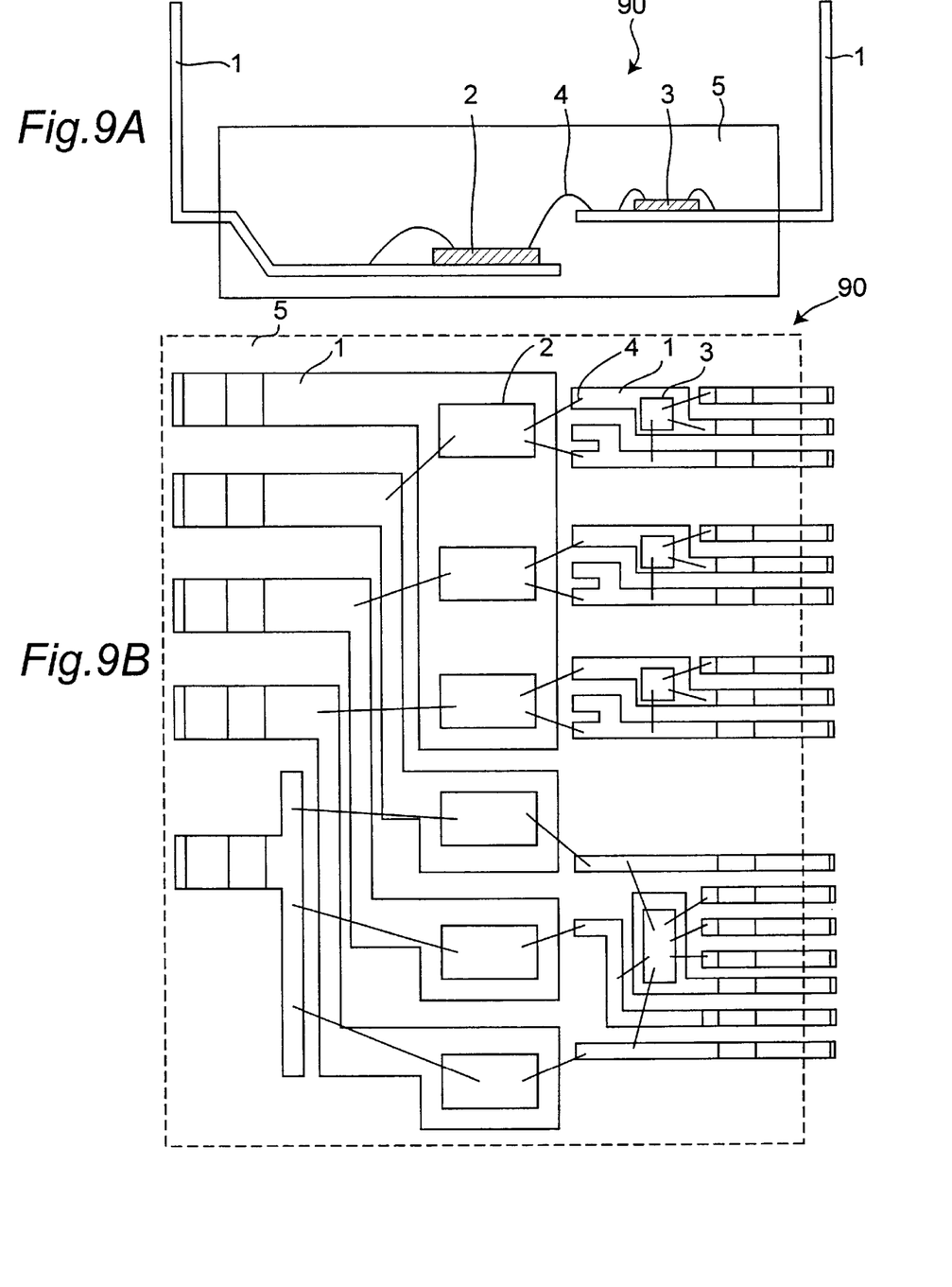
FIGS. 9A and 9B are diagrams of a conventional semiconductor module.

FIGS. 9A and 9B are diagrams showing a structure of conventional semiconductor module 90. FIG. 9A shows a cross-sectional view of semiconductor module 90. FIG. 9B is a top view of semiconductor module 90.

Referring now to FIGS. 9A and 9B, the configuration of semiconductor module 90 is discussed. Semiconductor module 90 includes a main circuit formed by left-side lead frame 1 equipped with power element 2 and a control circuit formed by right-side lead frame 1 equipped with control element 3. The main circuit is driven by the control circuit. Power element 2 is connected onto wiring formed by lead frame 1 by soldering. Control element 3 is also connected onto the wiring. Lead frame 1, power element 2, and control element 3 are electrically connected to one another by wire 4. A semiconductor power module is formed by molding power element 2 and control element 3 of this kind of semiconductor module 90 with mold resin 5. Part of lead frame 1 is exposed to the outside from mold resin 5. This section is used as electrodes to electrically connect to the outside, that is, main circuit terminal and control circuit terminal.

As understood from FIG. 9A, left-side lead frame 1 that forms the main circuit and right-side lead frame 1 that forms the control circuit are arranged to be deviated in the vertical direction with respect to the mounted surfaces of power element 2 and control element 3. The main circuit and lead frame 1 to which the main circuit is arranged are located on the same plane. Similarly, the control circuit and lead frame 1 to which the control circuit is arranged are located on the same plane.

Referring now to FIG. 9B, lead frame 1 of conventional semiconductor module 90 can be obtained by processing such as generally pressing a sheet of plate-form metal, and forms circuit wiring necessary for main circuit and control circuit, respectively. Wiring can be practically arranged on the same plane, since, as clear from the figure, all the wiring of lead frame 1 is formed without three-dimensionally intersecting one another,.

Because conventional semiconductor power modules have all the circuits composed with planate lead frames as well as practically and two-dimensionally in each circuit wiring of the main circuit and the control circuit, the physical dimensions must be upsized. This prevents downsizing semiconductor power modules, and consequently, it is unable to downsize the unit itself as well as to achieve large-scale integration.

In addition, since wiring inductance is increased by practically and two-dimensionally arranging circuit wiring, semiconductor module 90 may malfunction. Furthermore, because power element 2 of the main circuit section is allowed to radiate heat via lead frame 1 only, heat interferences occur between adjacent elements due to residual heat capacity of mold resin 5.

SUMMARY OF THE INVENTION

It is an object of the present invention to provide a semiconductor power module which can be downsized and which is malfunction-resistant.

A semiconductor unit according to the present invention includes the first circuit with the first semiconductor chip carried on the first lead frame and the second circuit with the second semiconductor chip carried on the second lead frame, which are sealed in a resin package. The first lead frame and the second lead frame are arranged to be overlapped. By arranging them overlapped, the physical dimensions of the unit can be reduced.

Another semiconductor unit according to the present invention includes the first circuit with the first three semiconductor chips carried on the first lead frame; the second circuit with the second three semiconductor chips, carried on the second lead frame, for controlling the corresponding first three semiconductor chips; the third circuit with third three semiconductor chips carried on the third lead frame; and the fourth circuit with fourth three semiconductor chips, carried on the fourth lead frame, for controlling the corresponding third three semiconductor chips, which are sealed in resin packages. Each of the first three semiconductor chips and each of the third three semiconductor chips are connected in series, respectively, and form a three-phase inverter as a switching element. The first lead frame and the third lead frame are arranged to be overlapped. Because lead frames of semiconductor chips connected in series which forms the three-phase inverter are arranged to be overlapped, the physical dimensions can be reduced. In addition, wiring inductance can be reduced.

Still another semiconductor unit according to the present invention includes the first circuit carrying first two semiconductor chips on the first lead frame and the second circuit carrying the second semiconductor chip on the second lead frame, which are sealed inside a resin package. The first lead frame is bent inside the resin package to form an overlap and first two semiconductor chips are arranged opposite to each other. Because the lead frame is formed by bending, no wiring to lead frames is required and the number of wire bonding can be reduced, and consequently, reliability related to defective wire bonding can be improved.

BRIEF DESCRIPTION OF THE DRAWINGS

These and other object and features of the present invention will become clear from the following description taken in conjunction with the preferred embodiments thereof with reference to the accompanying drawings, in which.

DETAILED DESCRIPTION OF THE PREFERRED EMBODIMENTS

Referring now to the drawings attached, preferred embodiments of the present invention will be described as follows.

(Embodiment 1)

In a semiconductor power module according to the present invention, a main circuit and a control circuit for controlling the operation of the main circuit are incorporated in one device. The main circuit contains a power element which is a semiconductor element for controlling electric power. In addition, the control circuit contains a control element which is a semiconductor element for controlling the operation of the main circuit. The semiconductor power module is primarily applied to devices for controlling motors, etc., such as inverter devices.

Figure 1:
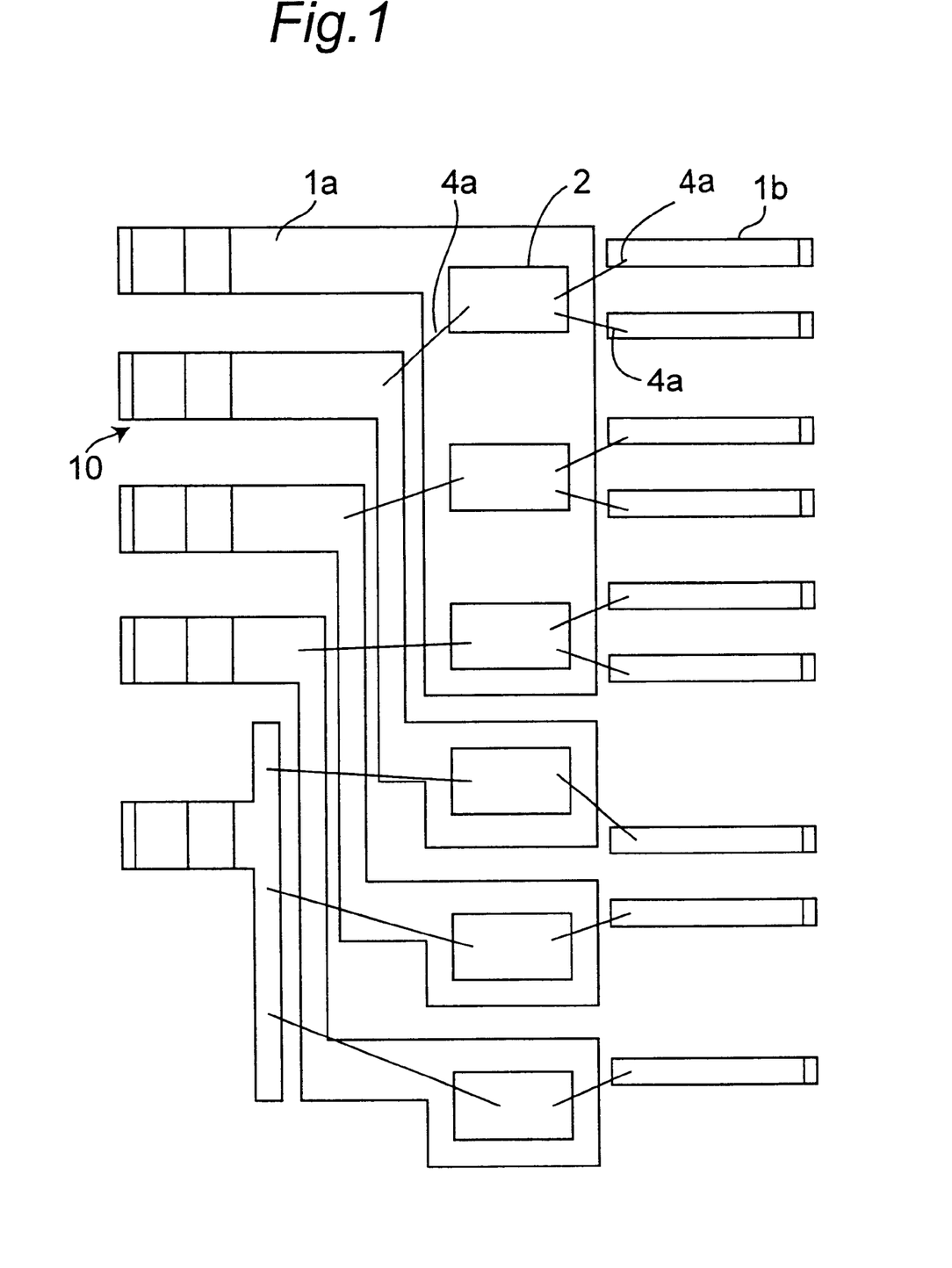
FIG. 1 is a top view of a two-dimensional configuration of a main circuit according to embodiment 1.
Figure 2:
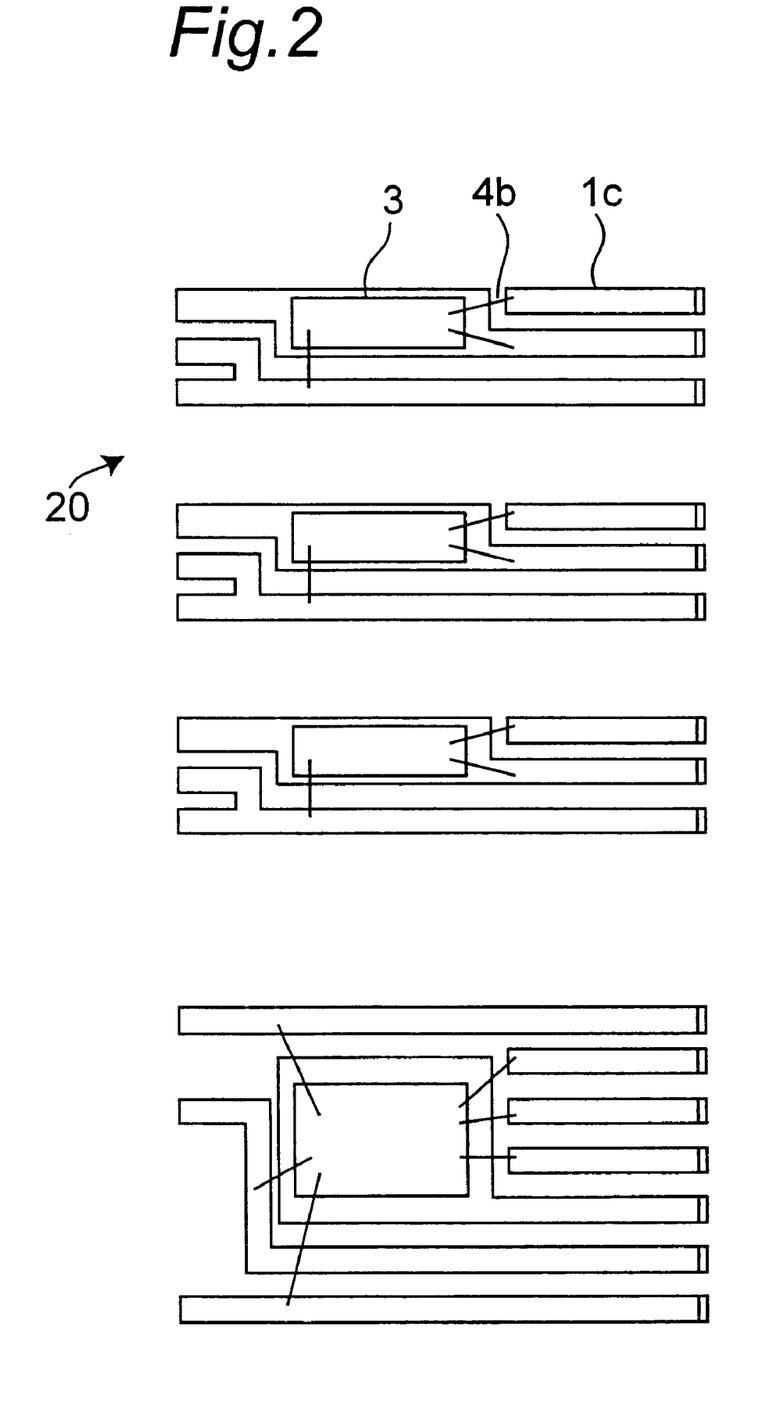
FIG. 2 is a top view of a two-dimensional configuration of a control circuit according to embodiment 1.

In embodiment 1, description will be made on semiconductor power module 30 (FIGS. 3A and 3B) in which a lead frame of main circuit 10 shown in FIG. 1 and a lead frame of control circuit 20 shown in FIG. 2 are overlapped, that is, laminated. Main circuit 10, control circuit 20, and semiconductor power module 30 will be described successively. Note that, in the drawings referred to as follows, reference characters are not assigned to all the elements. Components designated as reference characters are merely examples and similar components with no reference characters designated can be handled in the same manner.

FIG. 1 is a top view showing a two-dimensional configuration of main circuit 10. Main circuit 10 includes lead frames 1a, 1b, power element 2 mounted on lead frame 1a, and wire 4a that connects power element 2 and lead frame 1b. Lead frames 1a and 1b form wiring of main circuit 10. Power element 2 is a semiconductor chip and is electrically connected on wiring formed by lead frame 1a by soldering. Power element 2 is, for example, an IGBT, and a flywheel diode. Main circuit 10 has a pattern formed by one frame. Consequently, it can be handled two-dimensionally.

FIG. 2 is a top view showing a two-dimensional configuration of control circuit 20. Control circuit 20 includes lead frame 1c, control element 3, and wire 4b. Lead frame 1c forms wiring of control circuit 20. Control element 3 is also a semiconductor chip and is electrically connected to wiring formed by lead frame 1c by soldering. Control element 3 is an element for driving main circuit 10. Since control circuit 20 has also a pattern formed by one frame, it can be handled two-dimensionally.

Figure 3A:
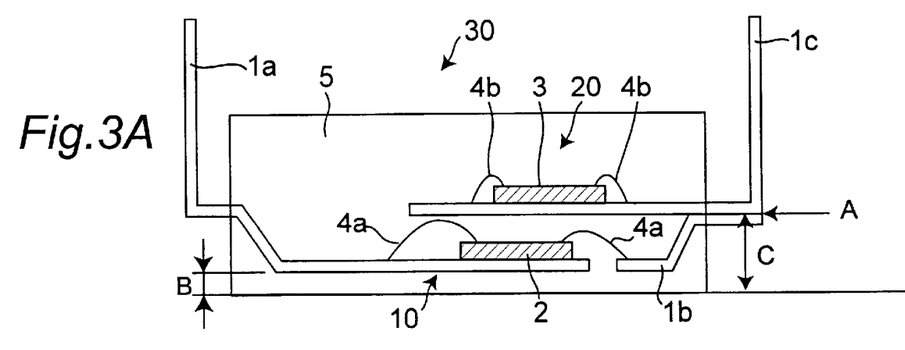
FIGS. 3A and 3B are a cross-sectional view and a top view of a semiconductor power module according to embodiment 1, respectively.
Figure 3B:
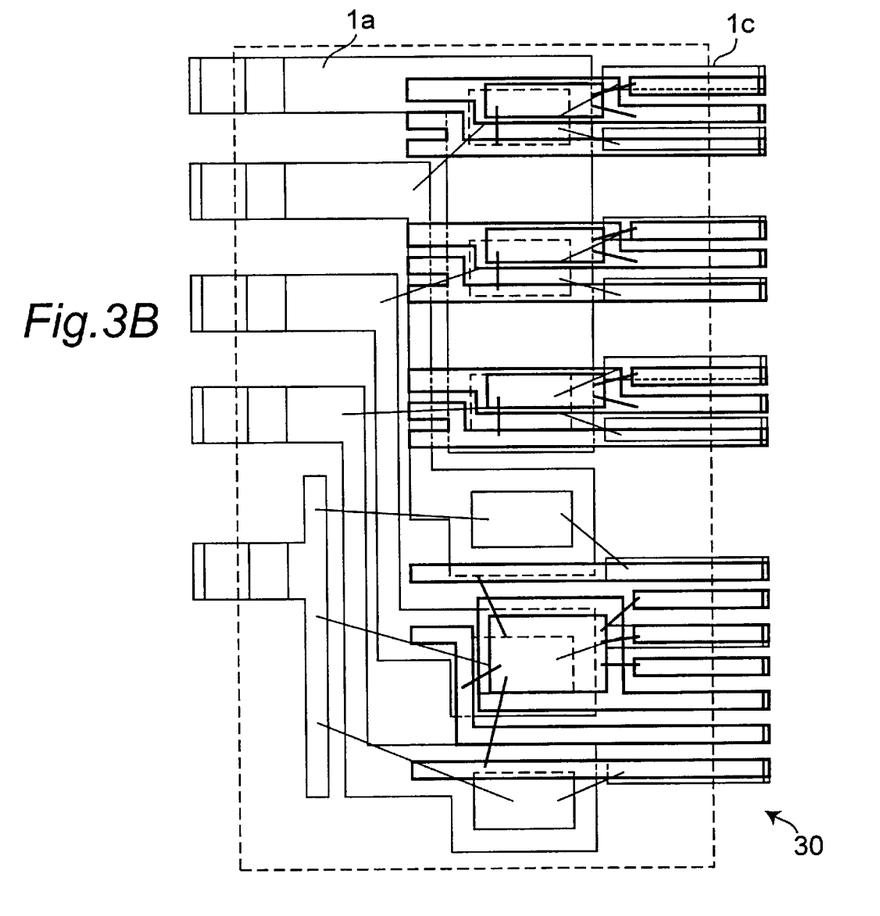

FIGS. 3A and 3B are diagrams showing semiconductor power module 30 constructed by laminating main circuit 10 and control circuit 20. FIG. 3A is a cross-sectional view of semiconductor power module 30. FIG. 3B is a top view of semiconductor power module 30.

One of the primary features of the present invention lies in laminating to arrange main circuit 10 (FIG. 1) and control circuit 20 (FIG. 2). To describe the feature more specifically, semiconductor power module 30 is three-dimensionally arranged by superimposing a surface on which component(s) of control circuit 20 are formed (FIG. 2) (hereinafter called the "control circuit 20-formed-surface") over the surface on which component(s) of main circuit 10 (FIG. 1) are formed (hereinafter called the "main circuit 10-formed-surface"). According to FIG. 3A, it can be understood that lead frame 1a of main circuit 10 and lead frame 1b of control circuit 20 are arranged to be overlapped. This means that power element 2 on the main circuit 10-formed-surface and control element 3 on the control circuit 20-formed-surface are arranged to be overlapped. By laminating to form main circuit 10 and control circuit 20, the physical dimensions can be reduced, as shown in FIG. 3B, as compared to conventional semiconductor module 90 (FIG. 9(b)) with overlaps practically not existing. Note that the overlap is carried out on the lead frame and is not related to the circuit configuration.

Semiconductor power module 30 is obtained by molding laminated main circuit 10 and control circuit 20 by mold resin 5. On the rear surface of lead frame 1a equipped with power element 2, the thickness of mold resin 5 is B in FIG. 3A, whereas the thickness of mold resin on the rear surface of lead frame 1c equipped with control element 3 is C in FIG. 3A. Increasing thickness of mold resin on the rear surface of lead frame 1c can improve noise resistance of semiconductor power module 30 and can still more reduce malfunction.

In order to secure electrical connection with the outside, part of lead frame 1a of main circuit 10 and part of lead frame 1c of control circuit 20 are extended to the outside of mold resin 5 and is bent at right angle upwards in the midway. Via these sections, semiconductor power module 30 is connected, for example, to an external power source and can control the amount of electric power supplied from the power source.

On the other hand, electrical connections inside semiconductor power module 30 can be secured between lead frame 1b of main circuit 10 and lead frame 1c of control circuit 20. The contact surface is called parting surface A where lead frames 1b and 1c are exposed to the outside from mold resin 5. Parting surface A is formed to align the surface of lead frame 1c to the surface of lead frame 1b. Two-dimensionally aligning positions of lead frames 1c and 1b can simplify molding process of mold resin 5 as well as simplifying the construction of resin molds used.

Portions that can be connected from the viewpoint of circuit may be overlapped vertically and they may be connected electrically using wires. However, it is much easier to process and to achieve higher reliability when components of main circuit 10 and control circuit 20 are connected externally than when they are connected internally before sealing by mold resin 5. Consequently, it is desirable to connect them after the mold resin 5 working process.

(Embodiment 2)

In embodiment 2, description will be made on a semiconductor power module having two power modules, each of which includes a main circuit and a control circuit for controlling the operation of the main circuit. More specifically, semiconductor power module 60 (FIGS. 6A and 6B) has power module 40 on P side, shown in FIG. 4, and power module 50 on N side, shown in FIG. 5, are overlapped (that is, laminated).

Figure 4:
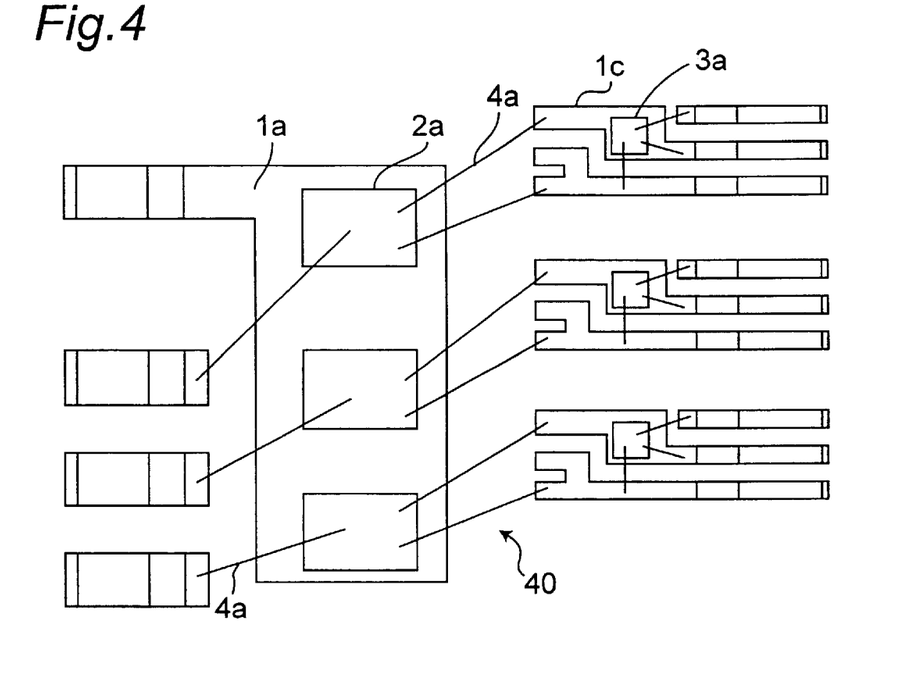
FIG. 4 is a top view of a two-dimensional configuration of a power module on the P side according to embodiment 2.

FIG. 4 is a top view showing a two-dimensional configuration of power module 40 on the P side. Power module 40 includes main circuit 10 (FIG. 1) and control circuit 20 (FIG. 2) explained in embodiment 1. That is, power module 40 includes lead frame 1a, power element 2a, and wire 4a that form the main circuit on the P side, and lead frame 1c and control element 3a that form the control circuit on the P side. Power element 2a and lead frame 1c are electrically connected by wire 4a. Power module 40 has patterns formed on single frame. Consequently, it can be handled two-dimensionally.

Figure 5:
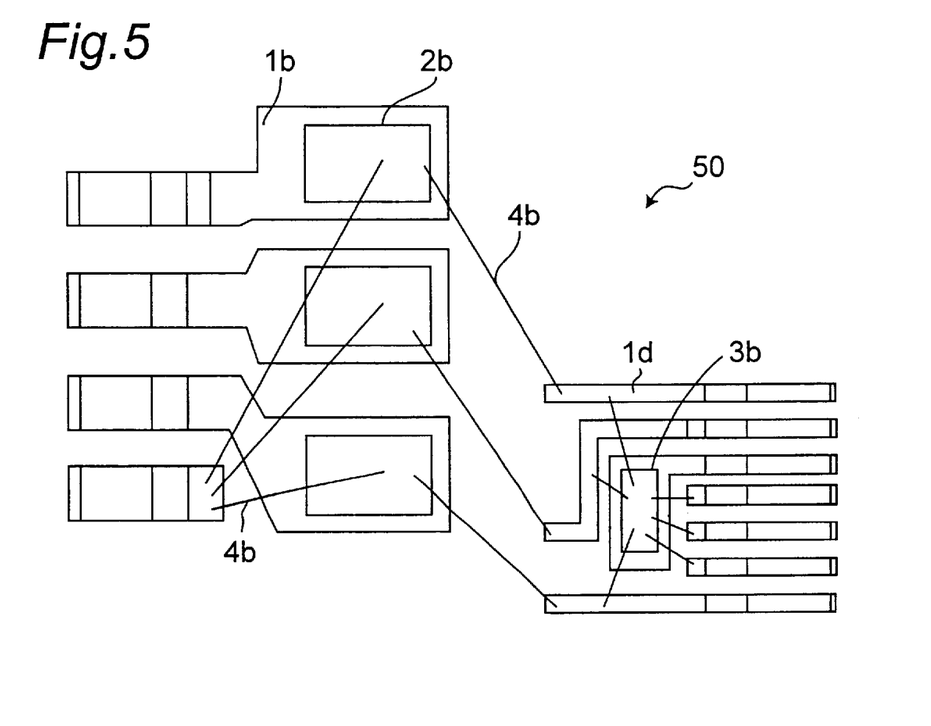
FIG. 5 is a top view of a two-dimensional configuration of a power module on the N side according to embodiment 2.

FIG. 5 is a top view showing a two-dimensional configuration of power module 50 on the N side. Power module 50 also includes main circuit 10 (FIG. 1) and control circuit 20 (FIG. 2) described in embodiment 1. That is, power module 50 is equipped with lead frame 1b, power element 2b, and wire 4b that form the main circuit on the N side and lead frame 1d and control element 3b that form the control circuit on the N side. Power element 2b and lead frame 1d are electrically connected by wire 4b. Since power module 50 has patterns also formed on single frame, it can be handled two-dimensionally.

The lead frames, power elements, and control elements used for power modules 40, 50 are the same as those explained in embodiment 1. Consequently, their descriptions will be omitted.

Figure 6A:
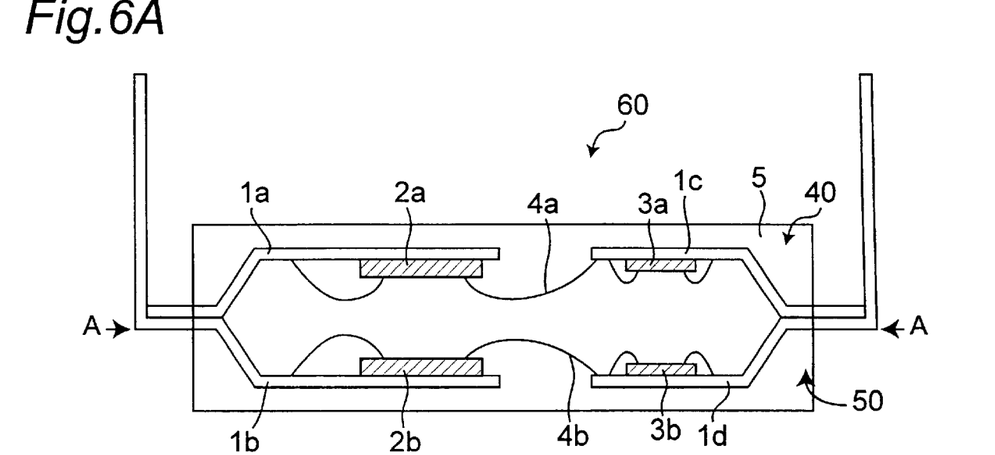
FIGS. 6A and 6B are a cross-sectional view and a top view of a semiconductor power module according to embodiment 2, respectively.
Figure 6B:
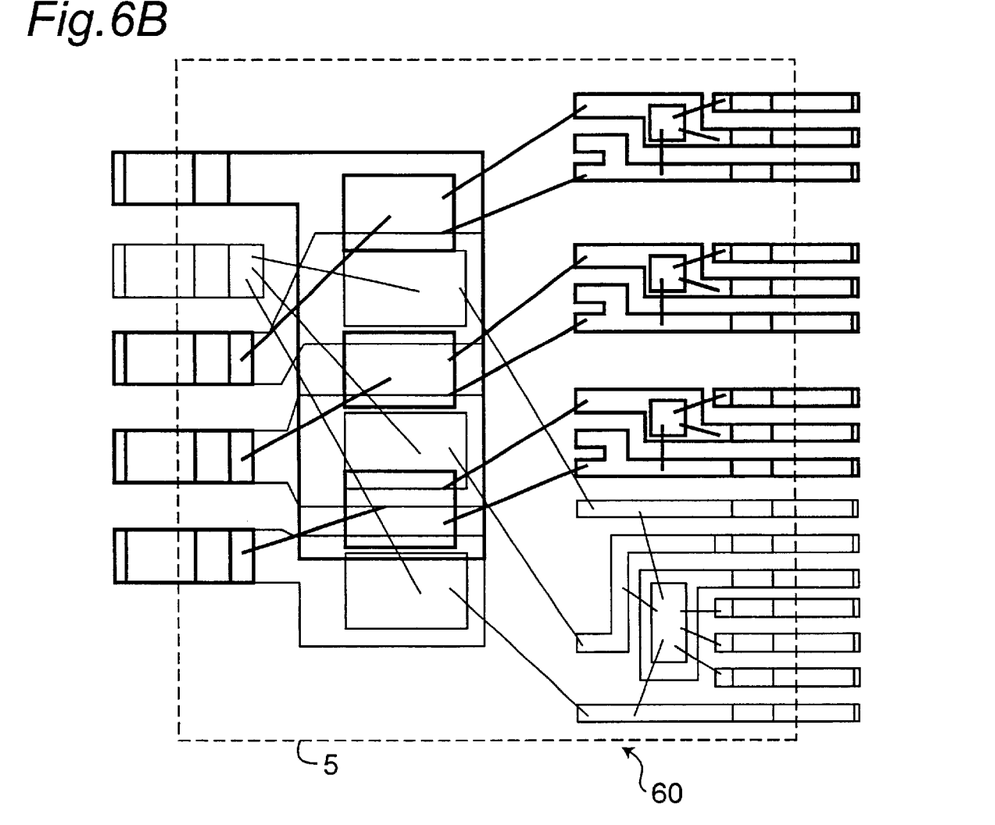

FIGS. 6A and 6B shows semiconductor module 60 formed by laminating P-side power module 40 (FIG. 4) and N-side power module 50 (FIG. 5). FIG. 6A is a cross-sectional view of semiconductor power module 60. FIG. 6B is a top view of semiconductor power module 60. Semiconductor power module 60 can be obtained by molding laminated power module 40 (FIG. 4) and power module 50 (FIG. 5) by mold resin 5.

Semiconductor power module 60 can be formed as, for example, a three-phase inverter circuit. As clear from FIG. 4 and FIG. 5, to each of the main circuits of P-side power module 40 and N-side power module 50, three sets of power elements 2a and 2b are mounted. Power element 2a operates as a P-side switching semiconductor chip. Power element 2b operates as an N-side switching semiconductor chip. According to this arrangement, three sets of one P-side switching element 2a and one N-side switching element 2b required for a 3-phase inverter circuit can be obtained. Note that, switching element 2a and switching element 2b are connected in series but each pair is connected in parallel.

According to FIG. 6A, it is understood that P-side power module 40 (FIG. 4) and N-side power module 50 (FIG. 5) are arranged to be overlapped. Furthermore, the power element or the control element is arranged to be overlapped facing each other. In other words, the power element or the control element equipped to the lead frame is located to the inner side of the mold resin 5 than the lead frame, and the rear surface of the frame is arranged to face to the outside. By installing the power element, which is a heat generating source, to be divided vertically and securing the radiation passage separately, the radiation efficiency can be improved. Consequently, heat interference between adjoining elements can be reduced. In addition, by forming to laminate power module 40 and power module 50, the physical dimensions can be reduced as shown in FIG. 6B.

In order to secure electrical connection with outside devices, part of lead frame 1a of power module 40 and part of lead frame 1b of power module 50 are extended to the outside of mold resin 5 and are bent upwards at right angles in the midway. As clear from FIG. 6B, P-side lead frame 1a of the main circuit and N-side lead frame 1b are arranged to be adjacent to each other. According to this extremely simple configuration of simply specifying the external lead arrangement, wiring inductance can be reduced. This applies to lead frames 1c and 1d. Via these sections, semiconductor power module 60 is connected to, for example, external power source and can control amount of electric power supplied from the power source.

On the other hand, electrical connection inside semiconductor power module 60 is secured between lead frame 1a of power module 40 and lead frame 1b of power module 50. It is also secured between lead frame 1c of power module 40 and lead frame 1d of power module 50. The connection surfaces are two parting surfaces A where lead frames 1b and 1c are exposed from mold resin 5 to the outside. Parting surface A is formed in such a manner that the surface of lead frame 1a is aligned to the surface of lead frame 1b and the surface of lead frame 1c is aligned to the surface of lead frame 1d. By connecting the position of each lead frame on the P side and on the N side to be aligned two-dimensionally, the molding process of mold resin 5 can be simplified and the construction of resin molds used can also be simplified.

(Embodiment 3)

Embodiment 3 describes a semiconductor power module in which a two-dimensionally formed main circuit is bent into a U-letter form.

Figure 7:
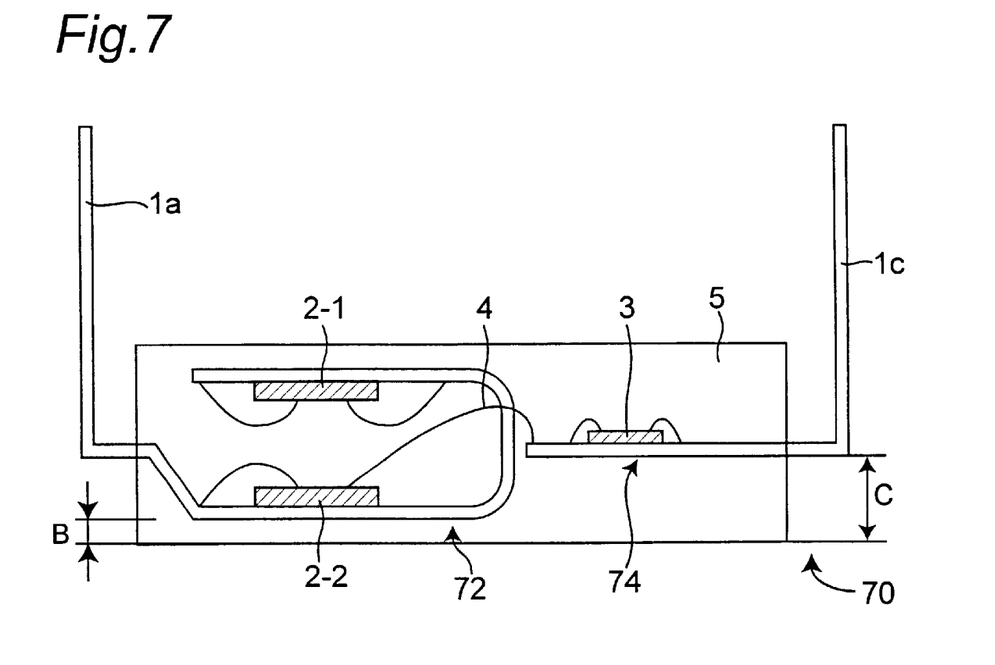
FIG. 7 is a cross-sectional view of semiconductor power module according to embodiment 3.

FIG. 7 is a cross-sectional view of semiconductor power module 70 according to embodiment 3. Semiconductor power module 70 has main circuit 72 and control circuit 74 molded with mold resin 5. Main circuit 72 is formed by means of lead frame 1a, to which power elements 2-1 and 2-2 are installed. Lead frame 1a is arranged to be bent in a U-letter form inside mold resin 5. Power elements 2-1 and 2-2 are bent in the condition to be mounted to the inner surface of lead frame 1a and at the same time with the rear surface of lead frame 1a directed to the outside. This can be obtained by molding power elements with mold resin 5 in the bent condition. Note that two power elements 2-1, 2-2 are identified but main circuit 72 is practically same as main circuit 10 (FIG. 1). Consequently, specific description on main circuit 72 is omitted.

On the other hand, control circuit 74 is formed by the use of lead frame 1c, to which control element 3 is installed. Control circuit 74 is practically the same as control circuit 20 (FIG. 2). Consequently, specific description on control circuit 74 is omitted.

Electrical connections inside semiconductor power module 70, that is, electrical connections between main circuit 72 and control circuit 74 are secured by wire 4. Wire 4 is connected to lead frame 1c via a clearance between patterns of lead frame 1a or bypassed to avoid an edge section of lead frame 1a. Needless to say, molding by mold resin 5 is carried out after wire 4 is installed.

Since inside semiconductor power module 70, one piece of lead frame 1a is arranged to be bent inside mold resin 5, the physical dimensions can be reduced and wiring inductance can be reduced. By installing the power element, which is a heat generating source, to be divided vertically and securing the radiation passage separately, the radiation efficiency can be improved. Consequently, heat interference between adjoining elements can be reduced. In addition, since the number of wire bonding can be reduced, reliability related to wire bonding failure can be improved.

Further, on the rear surface of lead frame 1a to which power element 2 is mounted, the thickness of mold resin 5 is B in FIG. 7, whereas on the mold resin thickness on the rear surface of lead frame 1c to which control element 3 is mounted is C in FIG. 7. By increasing mold resin on the rear surface of lead frame 1c, noise resistance of semiconductor power module 70 can be improved and malfunction can be further more reduced.

(Embodiment 4)

In semiconductor module 60 shown in FIG. 6A, lead frame 1a on one side is arranged separately from lead frame 1c. In addition, lead frame 1b on the other side is also arranged separately from lead frame 1d.

In embodiment 4, lead frames 1a and 1c on one side are brought in contact to each other and in addition lead frames 1b and 1d on the other side are also arranged to be in contact to each other. The contact is made by physical connections. By the way, electrical connections may be secured, and if it is not necessary, they may be brought into contact in the insulated condition.

Figure 8:
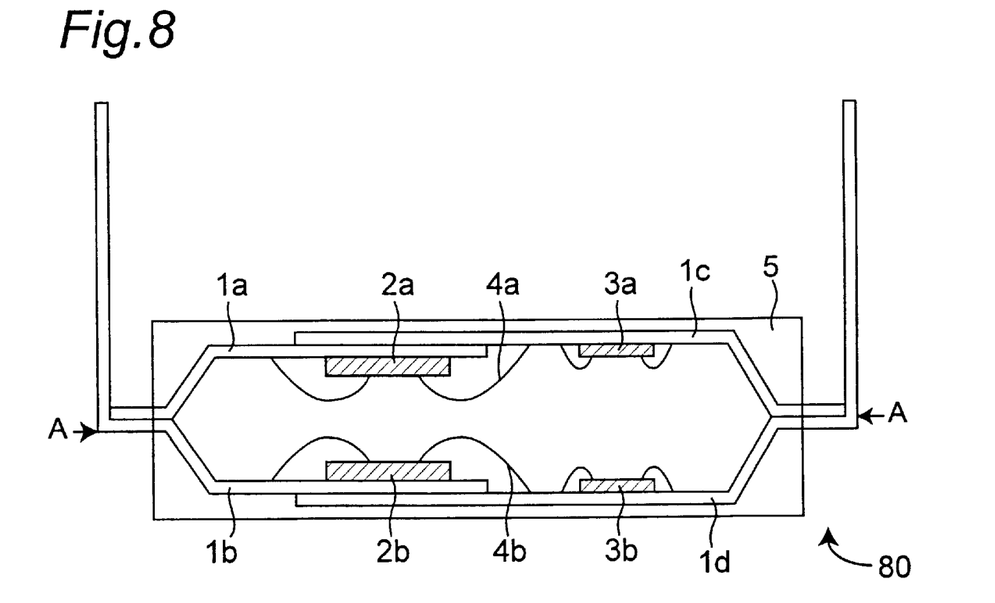
FIG. 8 is a cross-sectional view of semiconductor power module according to embodiment 4.

FIG. 8 is a cross-sectional view of semiconductor power module 80 according to embodiment 4. As described above, the difference between semiconductor power module 80 and semiconductor power module 60 (FIG. 6A) lies in the configuration and positional relationship of lead frames 1a, 1b, 1c, and 1d. Thus, only the difference is described hereinafter. Because each component of semiconductor power module 80 is the same as that of semiconductor power module 60, the description on them is omitted. As is the case described referring to FIG. 6, the 3-phase inverter can also be formed by semiconductor power module 80.

In semiconductor power module 80, some of lead frame 1c and 1d are extended more than those of semiconductor power module 60. They are arranged with the extended surface of lead frame 1c overlapped to the outside surface of lead frame 1a. In the same manner, they are arranged with the extended surface of lead frame 1d overlapped to the outside surface of lead frame 1b. Overlapping lead frame 1a of power element 2a to lead frame 1c of control element 3a and overlapping lead frame 1b of power element 2b to lead frame 1d of control element 3b enables heat generated in the main circuit or the control circuit to be radiated from the control circuit or the main circuit, and the heat radiation efficiency can be improved. It is needless to say that effects by semiconductor power module 60 can be obtained as they are.

The description on embodiments of the present invention has been made. In the description and drawings referred to in the above, the semiconductor power module is a package, the whole of which is molded with resin except part of lead frames. However, the back surface of the lead frame to which a heat generating source of power element, control element, etc. may be exposed from the package. Because with this configuration, heat can be released directly to the atmosphere, the heat radiation efficiency can be improved.

It will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor unit comprising:

a first circuit with a first semiconductor chip mounted on a first lead frame and a second circuit with a second semiconductor chip mounted on a second lead frame, which are sealed in a resin package, wherein the first lead frame and the second lead frame are arranged to be overlapped to each other.

2. The semiconductor unit according to claim 1, wherein a mounted surface of the first semiconductor chip in the first circuit and a mounted surface of the second semiconductor chip in the second circuit are substantially parallel, and wherein part of the first lead frame and part of the second lead frame are overlapped in a direction perpendicular to the mounted surfaces.

3. The semiconductor unit according to claim 1, wherein the first lead frame and the second lead frame are joined and electrically connected.

4. The semiconductor unit according to claim 3, wherein the first lead frame and the second lead frame are joined outside the resin package.

5. A semiconductor unit comprising:

a first circuit on which first three semiconductor chips are mounted on a first lead frame, a second circuit on which second three semiconductor chips for controlling the corresponding first three semiconductor chips are mounted on a second lead frame, a third circuit on which third three semiconductor chips are mounted on a third lead frame, and a fourth circuit on which fourth three semiconductor chips for controlling the corresponding third three semiconductor chips are mounted on a fourth lead frame, wherein the first, the second, the third and the fourth circuit are sealed in a resin package, wherein each of the first three semiconductor chips and each of the third three semiconductor chips are connected in series and form a 3-phase inverter as a switching element, and the first lead frame and the third lead frame are arranged to be overlapped.

6. The semiconductor unit according to claim 5, wherein each of the first three semiconductor chips and each of the third three semiconductor chips, connected in series, are arranged facing to one another.

7. The semiconductor unit according to claim 6, wherein the second lead frame and the fourth lead frame are arranged to be overlapped, and each of the second three semiconductor chips and each of the fourth three semiconductor chips are arranged facing to one another.

8. The semiconductor unit according to claim 7, wherein the first lead frame comes in contact with the second lead frame and the third lead frame comes into contact with the fourth lead frame.

9. The semiconductor unit according to claim 8, wherein the second lead frame is extended to a rear surface of the first lead frame on which the first three semiconductor chips are arranged, and wherein the fourth lead frame is extended to a rear surface of the third lead frame on which the third three semiconductor chips are arranged.

10. The semiconductor unit according to claim 8, wherein the first lead frame and the third lead frame are arranged to be adjacent to each other at outside of the resin package.

11. The semiconductor unit according to claim 5, wherein the first lead frame and the third lead frame are joined and electrically connected, and the second lead frame and the fourth lead frame are joined and electrically connected.

12. The semiconductor unit according to claim 11 wherein the first lead frame and the third lead frame as well as the second lead frame and the fourth lead frame are connected at outside of the resin package, respectively.

13. A semiconductor unit comprising:

a first circuit in which first two semiconductor chips are mounted on a first lead frame and a second circuit in which a second semiconductor chip is mounted on a second lead frame, which are sealed in a resin package, wherein the first lead frame is bent inside the resin package to form an overlap and the first two semiconductor chips are arranged to be opposite to each other.

* * * * *